(12) United States Patent
O'Toole et al.

(10) Patent No.: US 11,817,154 B2
(45) Date of Patent: Nov. 14, 2023

(54) OPTIMIZED THRESHOLD TRANSLATION FROM SERIALIZED PIPELINE

(71) Applicant: WESTERN DIGITAL TECHNOLOGIES, INC., San Jose, CA (US)

(72) Inventors: Kevin M. O'Toole, Chandler, AZ (US); Robert Ellis, Phoenix, AZ (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 170 days.

(21) Appl. No.: 17/210,428

(22) Filed: Mar. 23, 2021

(65) Prior Publication Data

US 2022/0310172 A1  Sep. 29, 2022

(51) Int. Cl.
| | |
|---|---|
| *G11C 16/34* | (2006.01) |
| *G11C 16/26* | (2006.01) |
| *G11C 16/04* | (2006.01) |
| *G11C 16/08* | (2006.01) |
| *G06F 11/10* | (2006.01) |

(52) U.S. Cl.
CPC .............. *G11C 16/26* (2013.01); *G06F 11/10* (2013.01); *G11C 16/0483* (2013.01); *G11C 16/08* (2013.01); *G11C 16/3427* (2013.01)

(58) Field of Classification Search
CPC .................................................. G11C 16/3427
See application file for complete search history.

(56) References Cited

U.S. PATENT DOCUMENTS

| | | |
|---|---|---|
| 8,879,325 B1 | 11/2014 | Bar et al. |
| 9,697,075 B2 | 7/2017 | Tate et al. |
| 10,283,215 B2 | 5/2019 | Marelli et al. |
| 10,290,358 B2 | 5/2019 | Alhussien et al. |
| 10,482,978 B2 | 11/2019 | Hsiao et al. |
| 2020/0066361 A1* | 2/2020 | Ioannou ................ G06F 3/0679 |

FOREIGN PATENT DOCUMENTS

WO  2018/003050 A1  4/2018

* cited by examiner

*Primary Examiner* — Jason Lappas
(74) *Attorney, Agent, or Firm* — ARENTFOX SCHIFF LLP

(57) ABSTRACT

Aspects of a storage device are provided that simplify the encoding or translation of optimized read voltage thresholds into a given NAND register format, which may vary depending on NAND technology, block type, page type, or gray code layout. The storage device may include a memory, a circuit that is configured to shift and combine read threshold voltage offsets into a joint read voltage threshold offset, and a controller configured to store the joint read voltage threshold offset in the memory. The circuit may be implemented in hardware of the controller. Alternatively, the controller software or firmware itself may shift and combine the read threshold voltage offsets into the joint read voltage threshold offset. As a result, the number of instructions that the controller typically performs in translating the optimized thresholds may be reduced. Moreover, the simplified translation may be scalable to different NAND technologies or page types.

20 Claims, 11 Drawing Sheets

OPTIMIZED THRESHOLD TRANSLATION FROM SERIALIZED PIPELINE

BACKGROUND

Field

This disclosure is generally related to electronic devices and more particularly to storage devices.

Introduction

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

When the flash storage device reads data from a cell of the flash memory, e.g. in a NAND page, a read voltage of the cell is compared against one or more read voltage thresholds, and the data stored in the cell (e.g. a logic 0 or 1) is identified based on the comparison. However, due to charge leakage in a cell or other factors, the read voltage thresholds may not clearly differentiate the stored data in the cells, resulting in possible data read errors that exceed the error correction code (ECC) capabilities of the flash storage device. To overcome this limitation, the flash storage device may optimize read threshold voltages for a NAND page by testing successful reads of the stored data in the cells at different threshold voltage offsets. Upon determining the optimized read threshold voltages (e.g., the read threshold voltage offsets corresponding to the optimized voltages), the flash storage device may apply the read threshold voltage offsets to minimize errors when reading data from the cells of that NAND page.

Generally, optimized read threshold voltages are computed in hardware for NAND pages associated with specific gray code layouts (e.g., 2-3-2, 1-3-3, etc.). For example, a flash storage device which implements a gray code layout of 2-3-2 may include blocks of triple-level cells (TLCs) having 2 bit transitions across erase and program states (e.g., two voltage thresholds) occurring in lower and upper NAND pages, and 3 bit transitions across erase and program states (e.g., three voltage thresholds) occurring in middle NAND pages. Accordingly, given such gray code layout, the flash storage device may compute two optimized read threshold voltages for lower pages (LPs), two optimized read threshold voltages for upper pages (UPs), and three optimized read voltage thresholds for middle pages (MPs). The optimized thresholds for each page type (e.g., LP, UP, MP) may then be returned in a serialized pipeline from the hardware.

SUMMARY

One aspect of a storage device is disclosed herein. The storage device includes a memory, a circuit, and a controller. The circuit is configured to shift and combine read threshold voltage offsets into a joint read voltage threshold offset. The controller is configured to store the joint read voltage threshold offset in the memory.

Another aspect of a storage device is disclosed herein. The storage device includes a memory and a controller. The controller is configured to shift and combine read threshold voltage offsets into a joint read voltage threshold offset, and to store the joint read voltage threshold offset in the memory.

A further aspect of a storage device is disclosed herein. The storage device includes a memory and a controller. The storage device includes means for shifting and combining read threshold voltage offsets into a joint read voltage threshold offset. The controller is configured to store the joint read voltage threshold offset in the memory.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
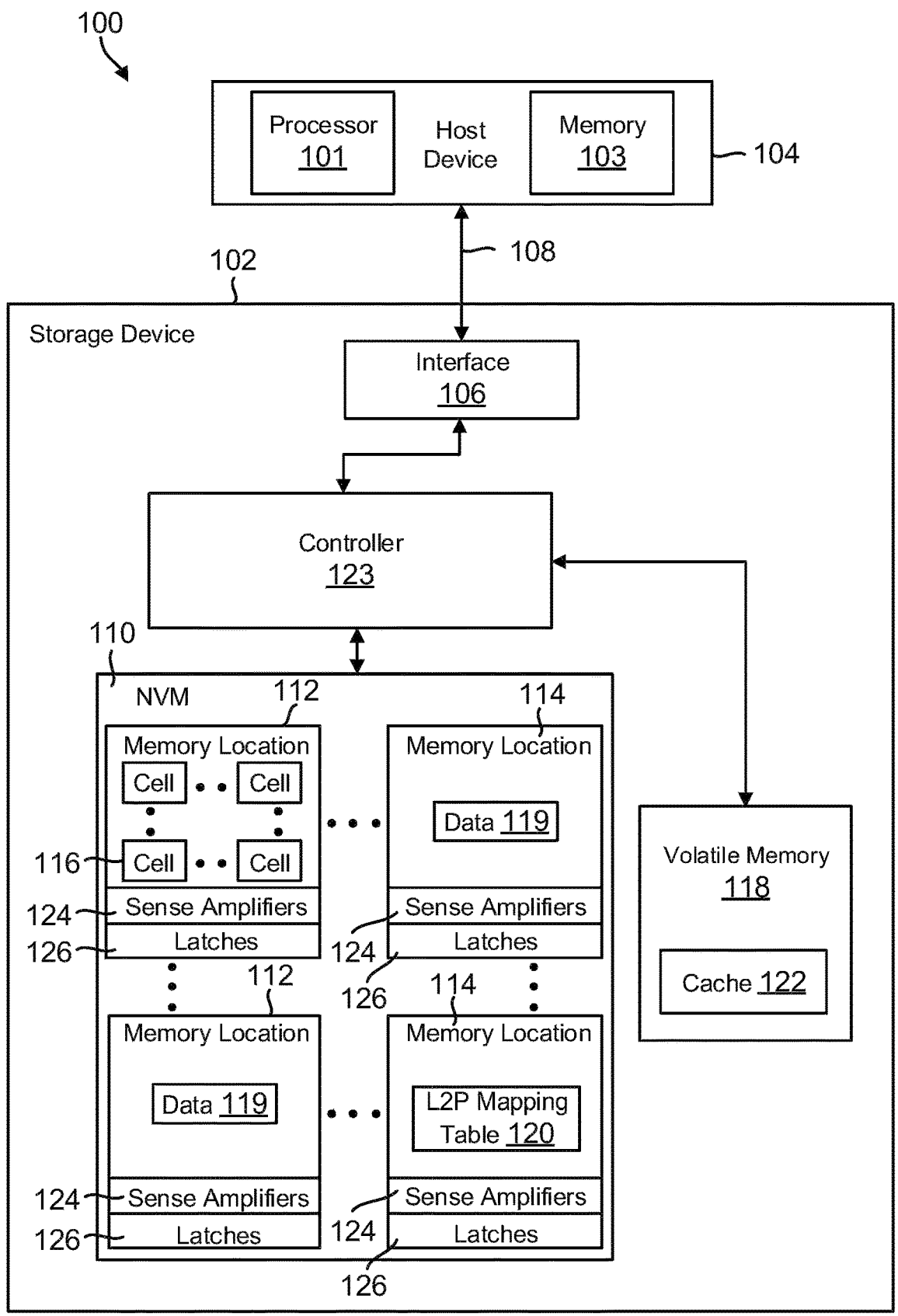
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Due to cell charge leakage or other factors, a shift in one or more default read threshold voltages may occur which exceeds the ECC capabilities of a flash storage device. In such case, the flash storage device may optimize the default read threshold voltages to improve the likelihood that data will be successfully read from flash memory. For example, the flash storage device may compute read threshold voltage offsets in hardware which are returned to the flash storage device in a serialized pipeline for each page type (e.g., LP, MP, UP), and the flash storage device may store these offsets in one of multiple NAND registers from which the optimized voltages represented by these offsets may be applied.

However, the format of the NAND registers may change for different NAND technologies (e.g., different Bit Cost Scaling (BiCS) generations), page types (e.g., LP, MP, UP), block types (e.g., single-level cell (SLC) blocks, TLC blocks, etc.), or gray code layouts (e.g., 2-3-2, 1-3-3, etc.). Such variability in NAND register format may cause the flash storage device to process a significant number of conditional statements or branches in order to determine the NAND register format which applies and where in the register(s) the optimized voltage threshold offset(s) may be stored. For example, in BiCS4×3 generations of flash storage devices incorporating a 2-3-2 gray code layout, multiple 4-byte NAND registers may be present, including a first NAND register having its first and third bytes associated with LPs and its second and fourth bytes associated with UPs, and a second NAND register having its first, second, and third bytes associated with MPs. In such case, if the firmware has obtained two optimized voltage threshold offsets for LPs, the firmware may encode the offsets, for example, by storing the first offset in the first byte of the first register and the second offset in the third byte of the first register. In contrast, if the firmware obtains two optimized voltage threshold offsets for UPs, the firmware may encode the offsets differently, for example, by storing the first offset in the second byte of the first register and the second offset in the fourth byte of the first register. Alternatively, if the firmware obtains three optimized voltage threshold offsets for MPs, the firmware may encode the offsets even differently, for example, by storing the offsets respectively in the first, second, and third bytes of the second register.

As a result, the firmware may undergo significant central processing unit (CPU)-intensive operations in order to determine how to encode optimized read voltage threshold offsets to match a given NAND register format. For example, the firmware may typically perform a brute force "if-else" check of NAND technology, block type, and page index in order to determine the NAND register and the fixed (hard-coded) memory locations of the NAND register in which the read threshold voltage offsets may be stored. However, such brute force approach may not be scalable as more NAND technologies, block types or page types are added, since additional conditional statements or branches (e.g., if-else or switch statements) would inefficiently result. Moreover, if the firmware attempts to implement such operations more simplistically through predictive branching, a significant amount of memory may be utilized and inefficient branch prediction misses may occur, especially as the number of NAND technologies, cell densities, and gray code layouts increase. Thus, rapid adaptation may not typically be achieved without significant firmware code changes or device and firmware revalidation costs. Additionally, the slow brute-force approach may cause additional delay in NAND read operations where quality of service (QoS) margins are typically quite thin.

Accordingly, to address the variability of NAND register formats especially in cases where disjoint thresholds may be returned (e.g., read voltage threshold offsets associated with inconsecutive or discontinuous NAND register memory locations such as described above for LPs and UPs), a controller of the storage device may include a threshold translation engine which translates or encodes the thresholds to comply with the NAND register format. The threshold translation engine may be implemented in hardware (e.g., for efficiency), in firmware (e.g., for flexibility), or in a combination of hardware and firmware. The controller may configure a data structure, such as a configuration table, which includes information for each page type including a threshold count and a list of bytes that contain a shift value for the position of each threshold in the NAND hardware registers. The threshold count indicates how many bytes are in the list of bytes, e.g., how many valid shift values are present for the different read thresholds. The shift values indicate in order the position of each expected threshold. During operation, the translation engine may determine a page prefix (e.g., the page type) defined in the NAND hardware for a given NAND page to index into the configuration table, identify the threshold count and the shift values associated with that page index, and shift and mask the offsets to build a joint read voltage threshold offset (e.g., a NAND register order threshold offset) from the ordered list of thresholds returned in the serialized pipeline. As a result, instruction reduction and extensibility may be achieved.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
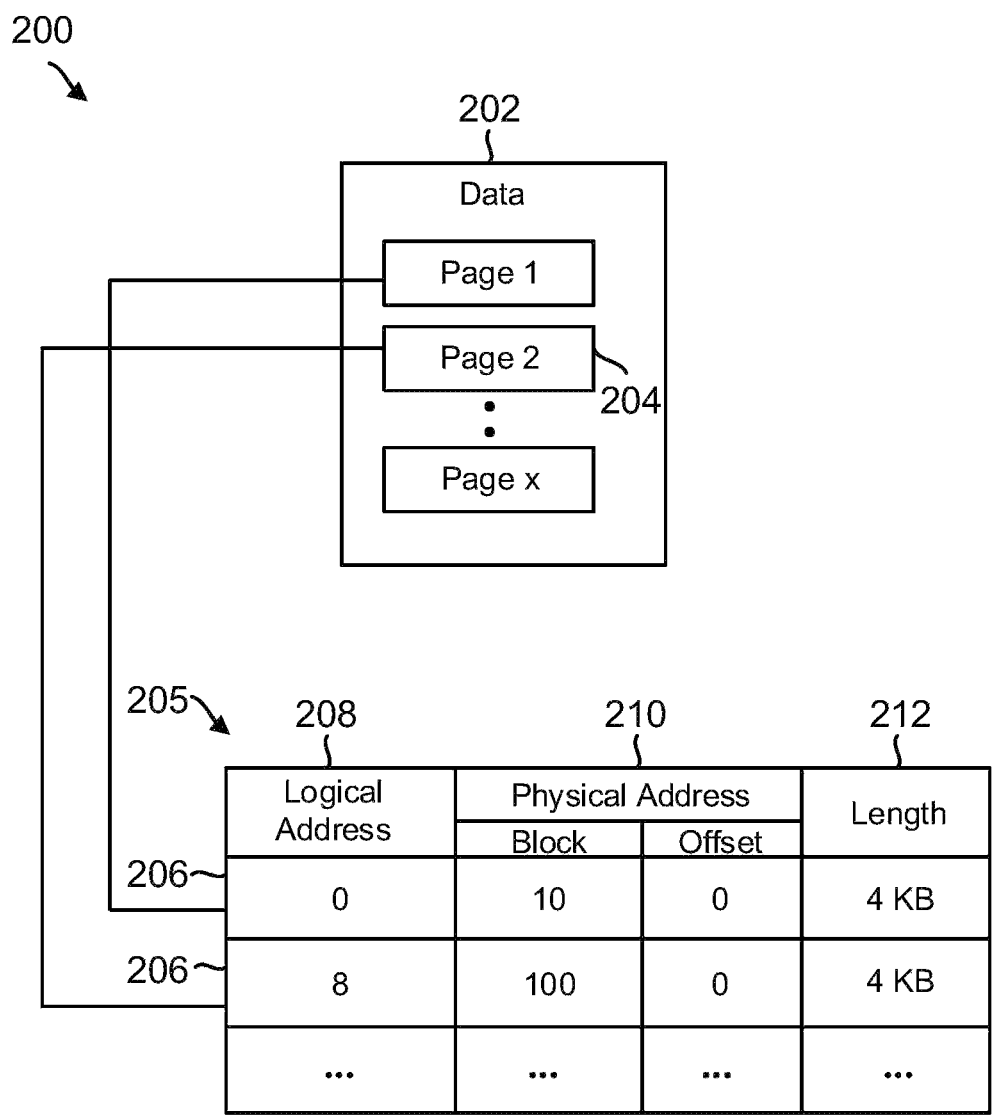
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
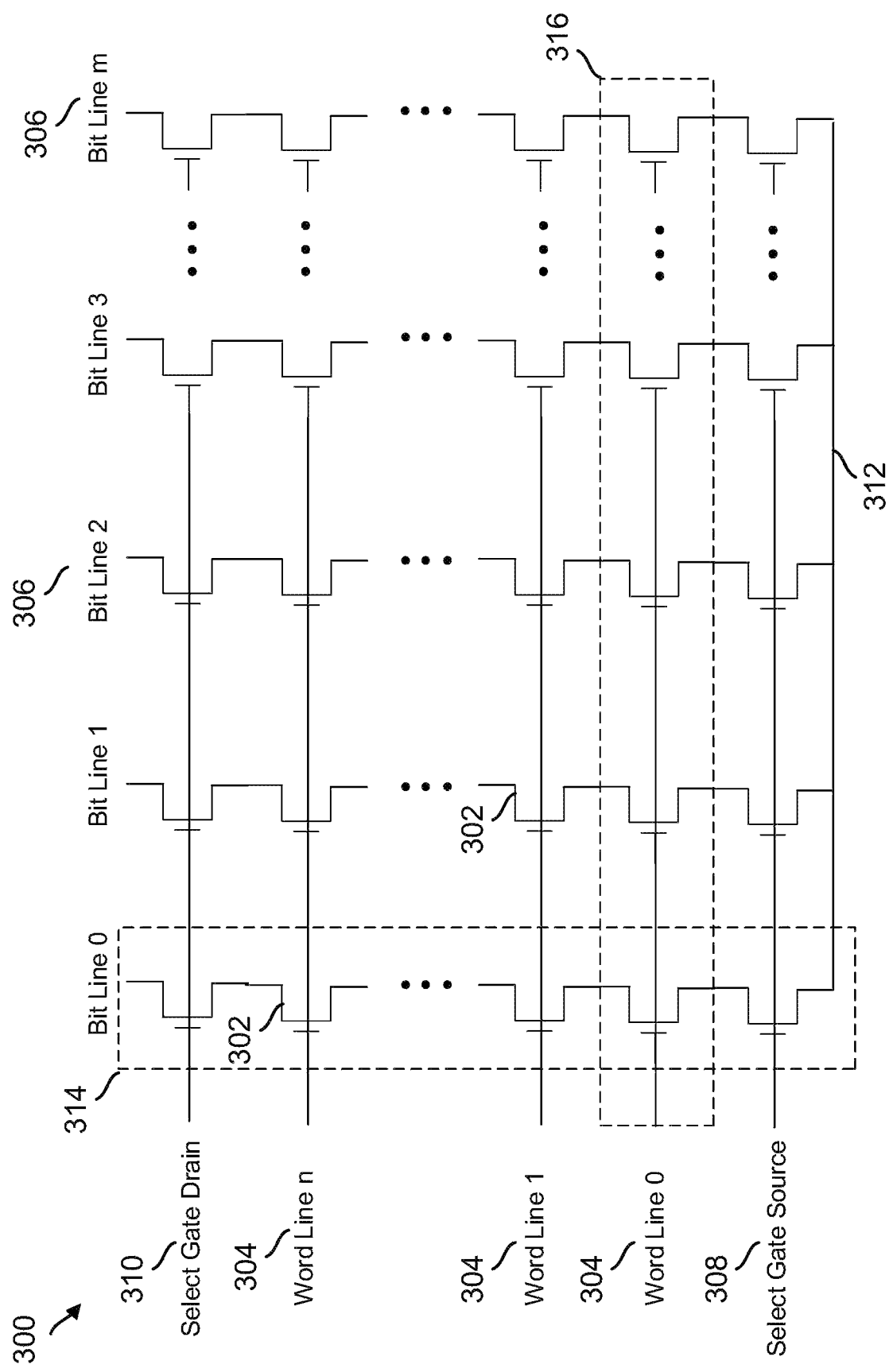
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
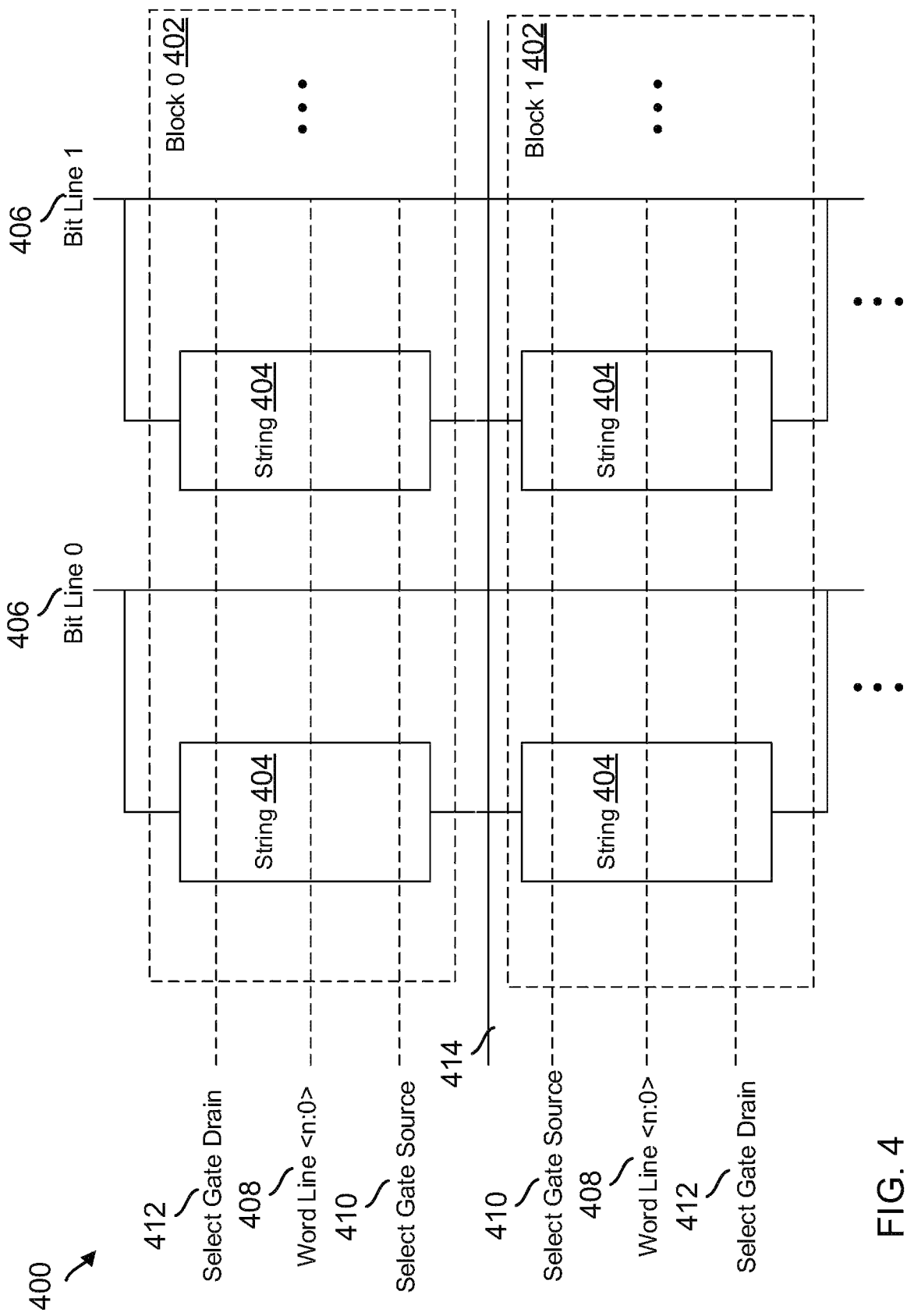
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. In one example, when programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming). Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
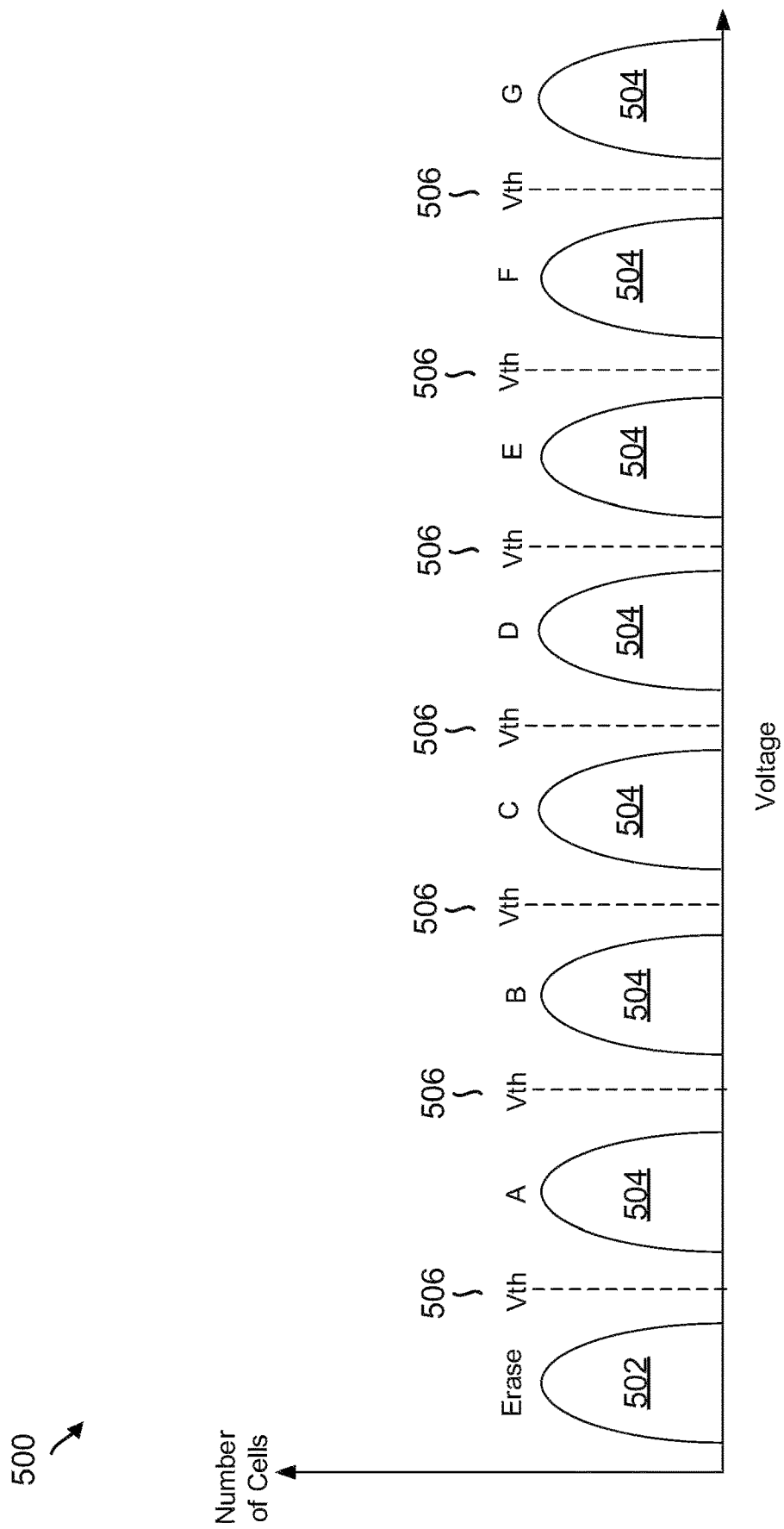
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

The logic or bit values of each program state 504 may depend on the gray code layout of the storage device 102. For instance, if the storage device 102 is associated with a 2-3-2 gray code layout (assuming a LP-MP-UP format, although the format may be different in other examples), the LP may include two bit transitions across erase and program states, the MP may include three bit transitions across erase and program states, and the UP may include two bit transition across erase and program states. This 2-3-2 gray code layout may be represented, for example, by the following combination of state logic values: Erase—111, A—011, B—001, C—000, D—010, E—110, F—100, G—101, which illustrates two MSB transitions across states (1-0-1), three center significant bit (CSB) transitions across states (1-0-1-0), and two LSB transition across states (1-0-1). Thus, a 2-3-2 gray code layout may include two threshold voltages corresponding to LPs (e.g., the threshold voltages 506 for program states A and E in FIG. 5), three threshold voltages corresponding to MPs (e.g., the threshold voltages 506 for program states B, D, F in FIG. 5), and two threshold voltages corresponding to UPs (e.g., the threshold voltages 506 for program states C, G in FIG. 5). In contrast, a 1-3-3 gray code layout may include a different combination of state logic values, with one threshold voltage corresponding to LPs, three threshold voltages corresponding to MPs, and three threshold voltages corresponding to UPs. Thus, different amounts of threshold voltages may correspond to different page types for a given gray code layout.

Moreover, while the controller 123 may read data 119 from cells 116, 302 using default read voltages (e.g. threshold voltages 506), in some cases the read threshold voltages may not clearly differentiate the stored data in the cells (e.g. as a logic 000, 001, etc.). For example, in some cases the threshold voltages 506 may overlap with one or more of the respective curves of FIG. 5, resulting in possible data read errors that are not correctable by ECC in the storage device 102. For instance, the threshold voltages may overlap to such extent that multiple bit errors are detected in response to a particular read. In such case, the controller may reduce read errors by optimizing the threshold voltages (e.g., such that the optimized threshold voltages do not overlap with the curves of FIG. 5) and storing offsets corresponding to the optimized threshold voltages in NAND read voltage threshold registers of the NVM 110. The controller may then modify the threshold voltages 506 according to the offsets stored in these registers when reading data from the cells 116, 302 of different NAND page types.

For example, in response to detecting an error in reading LP, MPs, or UPs associated with gray code layout 2-3-2, the controller 123 may identify two byte values corresponding to optimized voltage offsets with respect to two voltage thresholds 506 for reading a LP (e.g., offsets to the A and E state threshold voltages), three byte values corresponding to optimized voltage offsets with respect to three of the voltage thresholds 506 for reading an MP (e.g., offsets to the B, D, and F state threshold voltages), or two byte values corresponding to optimized voltage offsets with respect to two of the voltage thresholds 506 for reading an UP (e.g., offsets to the C and G state threshold voltages). The byte values associated with each page type may be computed in controller hardware and returned to the firmware in a serialized pipeline for each page type (e.g., a first ordered list of two byte values for the LPs, a second ordered list of three byte values for the MPs, and a third ordered list of two byte values for the UPs). Alternatively, the controller firmware may compute the byte values for each page type. After identifying these byte values, the controller may store these byte values in one or more NAND read voltage threshold registers in the NVM. When the controller subsequently reads data in a page of cells, the threshold voltages 506 for that page may be shifted accordingly based on the stored offsets in the registers, thus resulting in improved likelihood of successful page reads.

Figure 6:
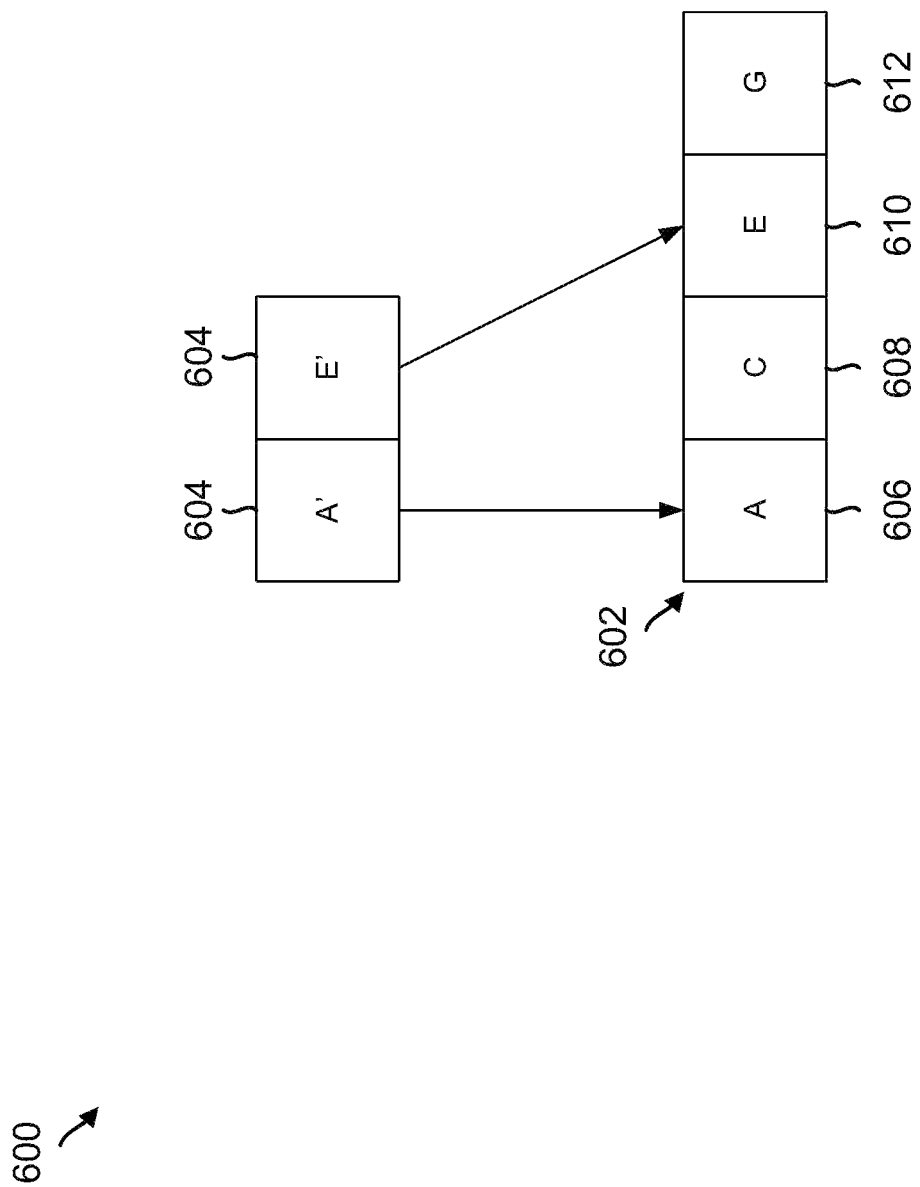
FIG. 6 is a conceptual diagram illustrating an example of read voltage threshold offsets stored in inconsecutive or discontinuous memory locations of a read voltage threshold register in the storage device of FIG. 1.

However, the format of the NAND read voltage threshold registers may change for different NAND technologies (e.g., different BiCS generations), page types (e.g., LP, MP, UP), block types (e.g., SLC blocks, TLC blocks, etc.), or gray code layouts (e.g., 2-3-2, 1-3-3, etc.). For instance, FIG. 6 illustrates an example 600 of a read voltage threshold register 602 having a particular register format for storing read voltage threshold offsets 604. The read voltage threshold register may be one of multiple registers stored in the NVM 110. In this example, read voltage threshold register 602 may be a 32-bit register including four, 8-bit memory locations or addresses dedicated to storing offsets corresponding to different voltage thresholds. For instance, in a 2-3-2 gray code layout such as described above, a first memory location 606 of the register 602 may be associated with an LP and store an offset for program state A, a second memory location 608 of the register may be associated with an UP and store an offset for program state C, a third memory location 610 of the register may be associated with an LP and store an offset for program state E, and a fourth memory location 612 of the register may be associated with an UP and store an offset for program state G. Thus, when the controller 123 reads data from a page of cells in the NVM, the voltage threshold 506 for program state A may be shifted by the offset in first memory location 606, the voltage threshold 506 for program state C may be shifted by the offset in second memory location 608, the voltage threshold for program state E may be shifted by the offset in third memory location 610, and the voltage threshold for program state G may be shifted by the offset in fourth memory location 612. Although not shown in FIG. 6, the NVM 110 may also include additional read voltage threshold registers for storing other offsets associated with other page types, such as a 32-bit register including memory locations associated with MPs for storing offsets for program states B, D, and F, a 32-bit register including a memory location associated with SLCs for storing offsets for a single cell program state, etc.

Such variability in NAND register format may cause the controller 123 to process a significant number of conditional statements or branches in order to determine the format of the read voltage threshold register 602 and where in the register(s) the optimized voltage threshold offset(s) 604 may be stored. For instance, in the example of FIG. 6, the controller 123 has obtained read voltage threshold offsets 604 corresponding to two optimized voltage thresholds respectively for program states A and E (represented by offsets A' and E') for a LP. However, in this example the first memory location 606 and the third memory location 610 may be inconsecutive or discontinuous (e.g., they are separated by second memory location 608), and so the controller encodes the offsets such that one of the read voltage threshold offsets A' is stored in first memory location 606 and another of the read voltage threshold offsets E' is stored in third memory location 610. In contrast, if the controller obtained read voltage threshold offsets corresponding to program states C and G for an UP, the controller encodes the offsets differently such that they are respectively stored in the second and fourth memory locations. Alternatively, if the controller obtained read voltage threshold offsets corresponding to program states B, D, and F for a MP, the controller again encodes the offsets differently such that they are respectively stored in the corresponding memory locations of another read voltage threshold register. Similarly, if the controller obtained a read voltage threshold offset corresponding to a single program state for an SLC, the controller again encodes the offset differently such that it is respectively stored in the corresponding memory location of an additional read voltage threshold register. As a result, the controller may perform inefficient CPU-intensive operations (e.g., conditional statement or branch checking) to determine how different read voltage threshold offsets 604 may be encoded for different read voltage threshold registers 602 depending on different page types, block types, NAND technologies, or other factors.

Accordingly, to more efficiently store read voltage threshold offsets 604 corresponding to different page types in the read voltage threshold registers 602, the controller 123 may include a threshold translation engine which translates or encodes the read voltage threshold offsets 604 to a given read voltage threshold register format based on a configuration table including information for each page type (e.g., SLC, LP, MP, UP). This engine may be implemented in hardware, firmware, or a combination of hardware and firmware.

Figure 7:
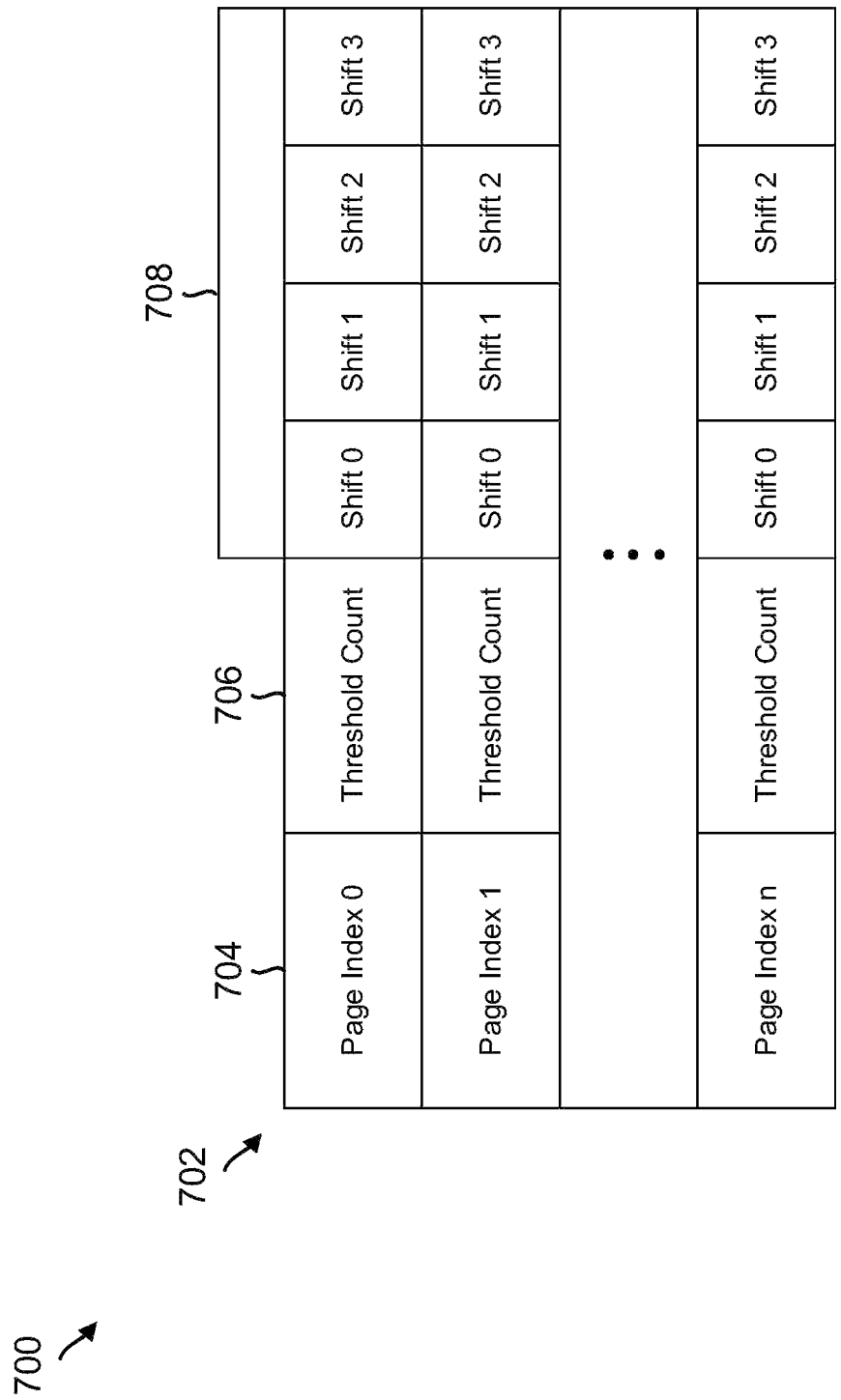
FIG. 7 is a conceptual diagram illustrating an example of a data structure indicating a threshold count and corresponding shift values for different page indices in the storage device of FIG. 1.

FIG. 7 illustrates an example 700 of a data structure 702, such as a configuration table, which includes information for each page type. Each page type in the configuration table may be represented by a page index 704, which the controller may identify for each page from the NVM 110. For each page index 704, the configuration table may include a threshold count 706, and a list of bytes containing shift values 708 corresponding to the memory locations 606, 608, 610, 612 in the read voltage threshold register 602. The threshold count 706 indicates the number of read voltage threshold offsets associated with a particular page index or type, and thus the number of shift values 708 for that same page index or type. For example, if the storage device 102 includes a 2-3-2 gray code layout such as described above, the data structure 702 may include one page index corresponding to an LP which is associated with a threshold count of 2 and two shift values, another page index corresponding to an MP which is associated with a threshold count of 3 and three shift values, and a further page index corresponding to an UP which is associated with a threshold count of 2 and two shift values. The controller may configure the data structure 702 to include a number n of page indices represented by the different page types currently in the NVM 110, for instance, pages of SLCs (e.g., SLC page), TLCs (e.g., LP, MP, UP), QLCs (e.g., LP, MP, UP, and top page (TP)), etc. The controller may configure the values of the threshold count 706 and shift value(s) 708 differently depending on the NAND technology (e.g., BiCS generation), block type, page type, or gray code layout.

During initialization of the storage device 102, the controller may configure the data structure 702 with the page indices 704 corresponding to the different page types in the NVM, the threshold counts 706 corresponding to the number of read voltage threshold offsets 604 for a given page type, and the shift values 708 corresponding to the memory locations 606, 608, 610, 612 in the read voltage threshold register 602. Afterwards, during run-time of the storage device, when the controller reads data in cells of a given page type, the controller may obtain optimized read voltage thresholds for that page (e.g., the read voltage threshold offsets 604), shift each of the offsets according to respective shift values in the configuration table, combine the shifted offsets into a joint read voltage threshold offset (which includes the number of offsets indicated by the threshold count), and store the joint read voltage threshold offset in the read voltage threshold register 602 accordingly. The controller may perform the shifting and combining in hardware (e.g., such as described below with respect to FIG. 9), in software or firmware (e.g., such as described below with respect to FIG. 10), or in a combination of hardware and software/firmware. Thus, the controller may avoid separately encoding each offset into a particular NAND register format following multiple conditional statement or branch determinations to identify fixed or hard-coded memory locations of a read voltage threshold register in which offsets corresponding to a particular NAND technology, block type, page type, or gray code layout are to be stored. Rather, the controller may initially configure the data structure 702 to effectively include this information, and the controller may efficiently encode the read voltage threshold offsets 604 into different memory locations of different read voltage threshold registers 602 in a simplified circuit or process (e.g., without the numerous conditional statements). As a result, instruction reduction and extensibility may be achieved.

Figure 8:
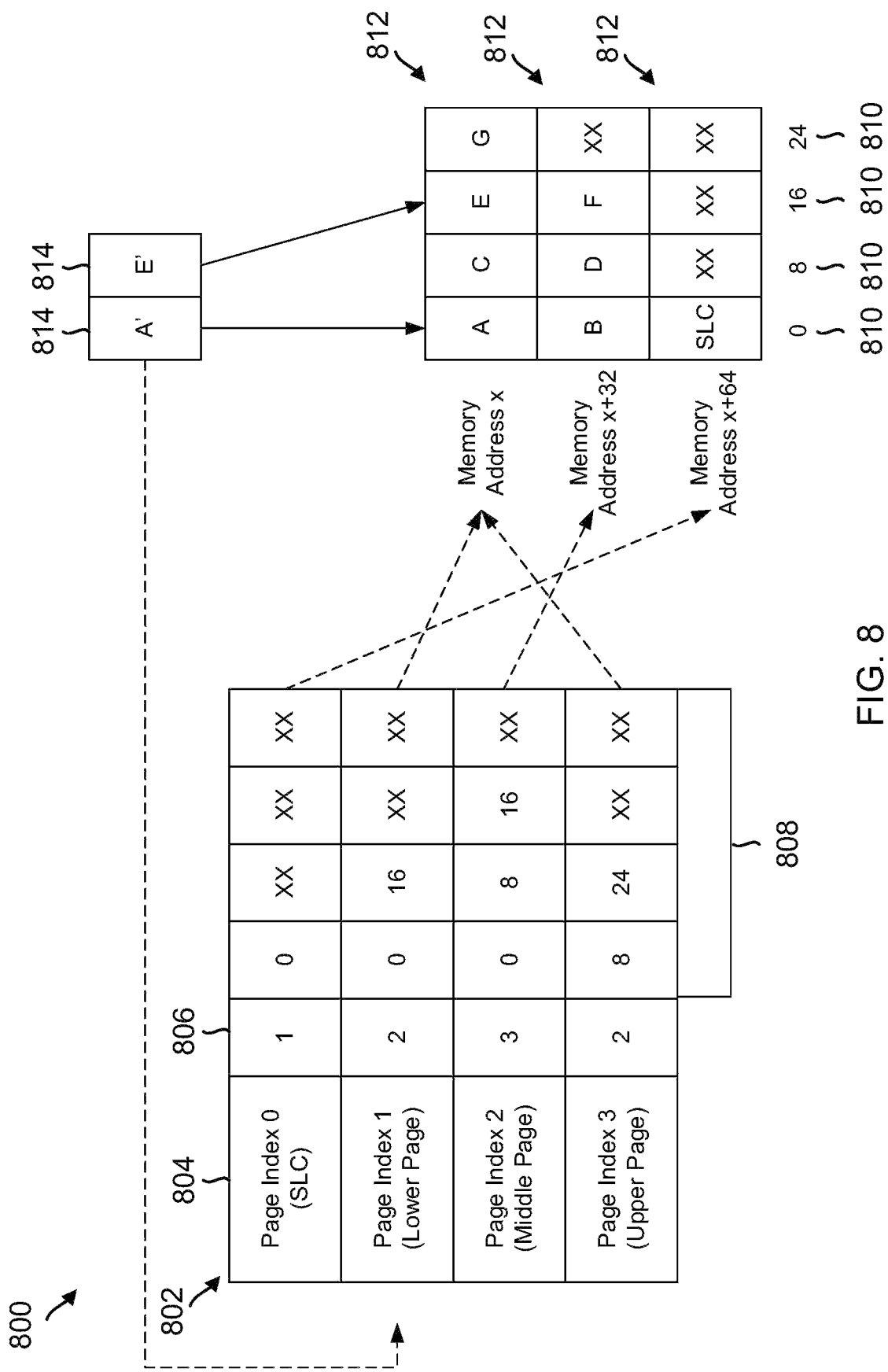
FIG. 8 is a conceptual diagram illustrating an example configuration of the data structure of FIG. 7 based on which read voltage threshold offsets are shifted and combined into a joint read voltage threshold offset and stored in one of multiple read voltage threshold registers in the storage device of FIG. 1.

FIG. 8 illustrates an example 800 of a data structure 802 including an exemplary configuration of page indices 804 (e.g., corresponding to SLCs, LPs, MPs, and UPs), threshold counts 806, and shift values 808 corresponding to different memory locations 810 of read voltage threshold registers 812. For instance, data structure 802 may correspond to data structure 702, page indices 804 may correspond to page indices 704, threshold counts 806 may correspond to threshold counts 706, shift values 808 may correspond to shift values 708, memory locations 810 may each correspond to one of the memory locations 606, 608, 610, 612, and read voltage threshold registers 812 may each correspond to the read voltage threshold register 602. The values of the configuration table (and the format of one or more of the read voltage threshold registers 812) may depend on the gray code layout. For instance, in this example, the storage device 102 may include a 2-3-2 gray code layout. Thus, page index 1 corresponding to a LP may include a threshold count of 2 and thus two shift values (in bits) corresponding to the memory locations of the 32-bit read voltage threshold register for program states A and E (e.g., memory address x, bit offset 0 for A and bit offset 16 for E). Similarly, page index 2 corresponding to a MP may include a threshold count of 3 and thus three shift values corresponding to the memory locations of the 32-bit read voltage threshold register for program states B, D, and F (e.g., memory address x+32, bit offset 0 for B, bit offset 8 for D, and bit offset 16 for F). Moreover, page index 3 corresponding to a UP may include a threshold count of 2 and thus two shift values corresponding to the memory locations of the 32-bit read voltage threshold register for program states C and G (e.g., memory address x, bit offset 8 for C and bit offset 24 for G). Additionally, page index 0 corresponding to a SLC may include a threshold count of 0 and thus one shift value corresponding to the memory location of the 32-bit read voltage threshold register for the SLC program state (e.g., memory address x+64, bit offset 0). The other shift values and memory locations 'XX' may be unused in this example.

Accordingly, in this example, when the controller obtains read threshold voltage offsets 814 (e.g., the read threshold voltage offsets 604 corresponding to optimized voltage thresholds for program states A and E, identified in this example by A' and E'), the controller may shift and combine the read threshold voltage offsets 814 into a joint read voltage threshold offset based on the information in data structure 802, and the controller may store the offsets in the appropriate memory locations of the corresponding read threshold voltage register 812. For instance, since voltage offsets A' and E' correspond to the LP in this 2-3-2 gray code layout, the controller may obtain from the data structure 802 the threshold count of 2 and the two shift values for A' and E' associated with page index 1. The controller may then separately determine whether and by how much to shift offsets A' and E' respectively based on the two shift values.

For instance, since offset A' is associated with shift value 0 in this example (e.g., memory location A corresponds to bit offset 0), the controller does not shift offset A' since it can be directly stored in memory location A (or stated another way, the controller shifts offset A' by 0 bits to align with memory location A). Moreover, since offset E' is associated with shift value 16 in this example (e.g., memory location E corresponds to bit offset 16), the controller shifts offset E' by 16 bits to align with memory location E, and the controller combines the shifted offset E' with the not shifted (or 0-bit shifted) offset A' to result in joint offset A'E'. For instance, if offset A' is 00001111, and offset E' is 10101010, the controller may shift and combine the offsets to result in joint offset 00001111000000001010101000000000 (with the first byte corresponding to A indicated by A', the second byte corresponding to C unused for LPs and thus padded with 0's, the third byte corresponding to E indicated by E', and the fourth byte corresponding to G unused for LPs and thus padded with 0's). The controller may then store the joint offset directly in the corresponding register memory locations A, C, E and G, resulting in A' properly aligning with A and E' properly aligning with E. The controller may then read the data in a LP in response to the shifted voltage offsets.

Alternatively, if the controller obtains different voltage offsets C' and G' corresponding to the UP in this 2-3-2 gray code layout, the controller may similarly shift and combine the offsets based on the corresponding row in the data structure (page index 3) to result in the joint voltage threshold offset. For instance, the controller may shift C' by 8 bits and G' by 24 bits to result in joint offset C'G'. For instance, if offset C' is 11111111 and offset G' is 01010101, the controller may shift and combine the offsets to result in joint offset 00000000111111110000000001010101 (with the first byte corresponding to A unused for UPs and thus padded with 0's, the second byte corresponding to C indicated by C', the third byte corresponding to E unused for UPs and thus padded with 0's, and the fourth byte corresponding to G indicated by G'). The controller may then similarly store the joint offset directly in the corresponding register memory locations A, C, E and G, resulting in C' properly aligning with C and G' properly aligning with G. The controller may then read the data in a UP in response to the shifted voltage offsets.

Thus, using the information in data structure 802, the controller may apply the same logic to store different offsets in different memory locations of the read voltage threshold registers using a shift and combine approach. In this way, the controller can refrain from performing inefficient CPU-intensive operations (e.g., brute-force if-else checks) to determine how to encode different read threshold voltage offsets. Moreover, this shift and combine approach may be implemented in hardware of the controller (e.g., for efficiency such as described below with respect to FIG. 9) or in software/firmware of the controller (e.g., for flexibility such as described below with respect to FIG. 10).

Figure 9:
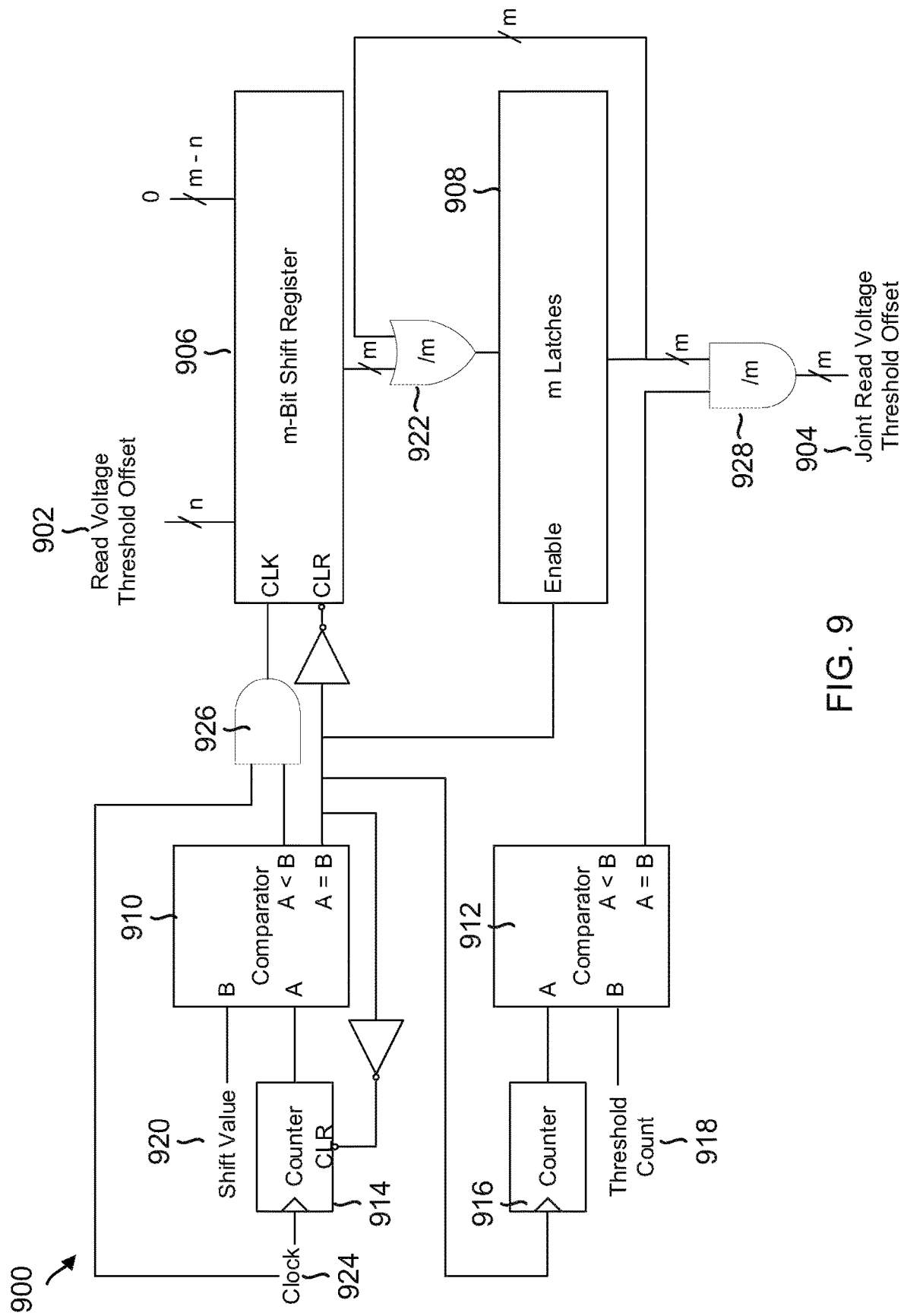
FIG. 9 is a conceptual diagram illustrating an example of a circuit that shifts and combines read threshold voltage offsets into a joint read voltage threshold offset in the storage device of FIG. 1.

FIG. 9 illustrates an example of a circuit 900 that shifts and combines read voltage threshold offsets 902 (e.g., read voltage threshold offsets 604) into a joint read voltage threshold offset 904. Circuit 900 may be implemented in hardware of the controller 123, e.g., in an ASIC or other chip or component of the controller. While circuit 900 illustrates an example arrangement of various components including shift register 906, latches 908, logic gates (e.g., AND, OR, etc.), digital comparators 910, 912, and counters 914, 916, the circuit is not limited to these components or their arrangement. For instance, the circuit may shift and combine read voltage threshold offsets to form the joint read voltage threshold 904 in other ways (e.g., using other components or logic design) than as illustrated in FIG. 9. Moreover, while FIG. 9 illustrates a specific example implementing right-shift registers and up counters, in other examples, left-shift registers and/or down counters may be used.

As described above, read voltage threshold offsets may be obtained in a serialized pipeline for each page type. Thus, circuit 900 may receive an ordered list of read voltage threshold offsets 902, one offset at a time, following voltage threshold optimization for a given page type. Circuit 900 may also receive a threshold count 918 (e.g., threshold count 706, 806) and shift values 920 (e.g., shift value 708, 808) from a data structure in memory (e.g., a configuration table such as in data structure 702, 802). The shift value corresponding to each read voltage threshold offset may similarly be obtained in a serialized manner to coincide with the corresponding read voltage threshold offset.

The shift register 906 may a parallel-in-parallel-out shift register including m input bits and m output bits. Of these m input bits, n of these bits may correspond to the read voltage threshold offset 902, while the remainder m−n of these bits may be a fixed value (e.g., 0). For instance, if m=32 and n=8, then shift register 906 may be a 32-bit shift register which receives an 8-bit read voltage threshold and 24-bits of logic '0' in parallel. The m output bits of the shift register may respectively be fed in parallel into m OR gates 922 (e.g., each bit output from the shift register is input into a corresponding OR gate), and the output of the m OR gates may respectively be inputs to the latches 908 (e.g., each bit output from one of the OR gates is input into a corresponding latch). The output from each latch is also fed back as an input into each OR gate 922 to allow the latches 908 to store accumulated data from the shift register 906.

The shift register 906 may shift bits in response to a rising edge of a clock 924 based on an output of comparator 910 and counter 914. The comparator 910 may be a digital comparator which receives an output from the counter 914 as one input A, and the shift value 920 corresponding to the current read voltage threshold offset as another input B. The comparator 910 may also include multiple outputs, including but not limited to one output corresponding to A<B and another output corresponding to A=B. When A is less than B, the output A<B is true (logic 1) and the output A=B is false (logic 0), and when A=B, the output A<B is false (logic 0) and the output A=B is true (logic 1). Similarly, comparator 912 may be a digital comparator which receives output from counter 916 as one input A, and the threshold count 918 as another input B. The comparator 912 may also include multiple outputs corresponding to A<B and A=B similar to comparator 910, although comparator 912 is similarly not limited to these outputs.

In one example of operation, the shift register 906 and counters 914, 916 may be initialized to all 0's, and an initial read voltage threshold offset and shift value in the pipeline may be received. While the value of the counter (A) is less than the value of the shift value (B), the output A<B of comparator 910 will be logic 1, enabling the clock 924 to pass through AND gate 926 and activate the shift register 906 to shift one of the bits of the read voltage threshold offset 902 each clock cycle. The counter 914 may also increment by one in response to each rising edge of the clock 924, confirming that a shift has occurred. Thus, while the value of counter 914 (A) is less than the shift value 920 (B) (the A<B output of comparator 910 is logic 1), the shift register may continue to shift bits of the read voltage threshold offset and the counter may continue to increment in response to the clock 924. Once the value of the counter (A) equals the value of the shift value (B), and thus after the shift register has shifted the read voltage threshold offset 902 by the number of bits indicated in shift value 920, the output A=B of comparator 910 will become logic 1, thereby enabling the latches 908 to store the final shifted output of the shift register 906. The output A=B may also be coupled to the clock input of counter 916, which increments by one in response to the output A=B of comparator 910 changing from 0 to 1. Thus, counter 916 may increment by one every time a number of shifts equal to shift value 920 in shift register 906 has occurred (i.e., after a threshold has been fully accounted for).

Afterwards, the counter 914 and shift register 906 will be cleared (e.g., reset to all 0's), and the next read voltage threshold offset 902 and shift value 920 in the pipeline may be received. Following receipt of these new inputs, counter 914 will re-increment, the output A<B of comparator 910 will again be logic 1, and shift register 906 will shift the new read voltage threshold offset by the new shift value in response to clock 924 as previously described. Once output A=B of comparator 910 is logic 1, latches 908 will again be enabled to store the final shifted output of shift register 906. Moreover, the previously data in latches 908 will be fed back to the OR gates 922 with the new data such that latches 908 may store previous and new data corresponding to different read voltage threshold offsets. Additionally, counter 916 will again increment by one in response to the logic 1 output A=B of comparator 910, and the process above may continue to repeat for other read voltage threshold offsets in the pipeline while the value of the counter 916 (A) is less than the threshold count (B).

Additionally, while the value of counter 916 (A) is less than the threshold count 918 (B), the output A=B of comparator 912 will be logic 0, preventing the output of latches 908 from passing through AND gate 928 until all thresholds have been counted. Once the value of the counter 916 (A) equals the value of the threshold count (B), the output A=B of comparator 912 will be logic 1, enabling the accumulated data stored in latches 908 to pass through AND gate 928 and be output as joint read voltage threshold offset 904. Thus, circuit 900 may continue to shift and combine read voltage threshold offsets 902 until joint read voltage threshold offset 904 is ultimately formed.

Figure 10:
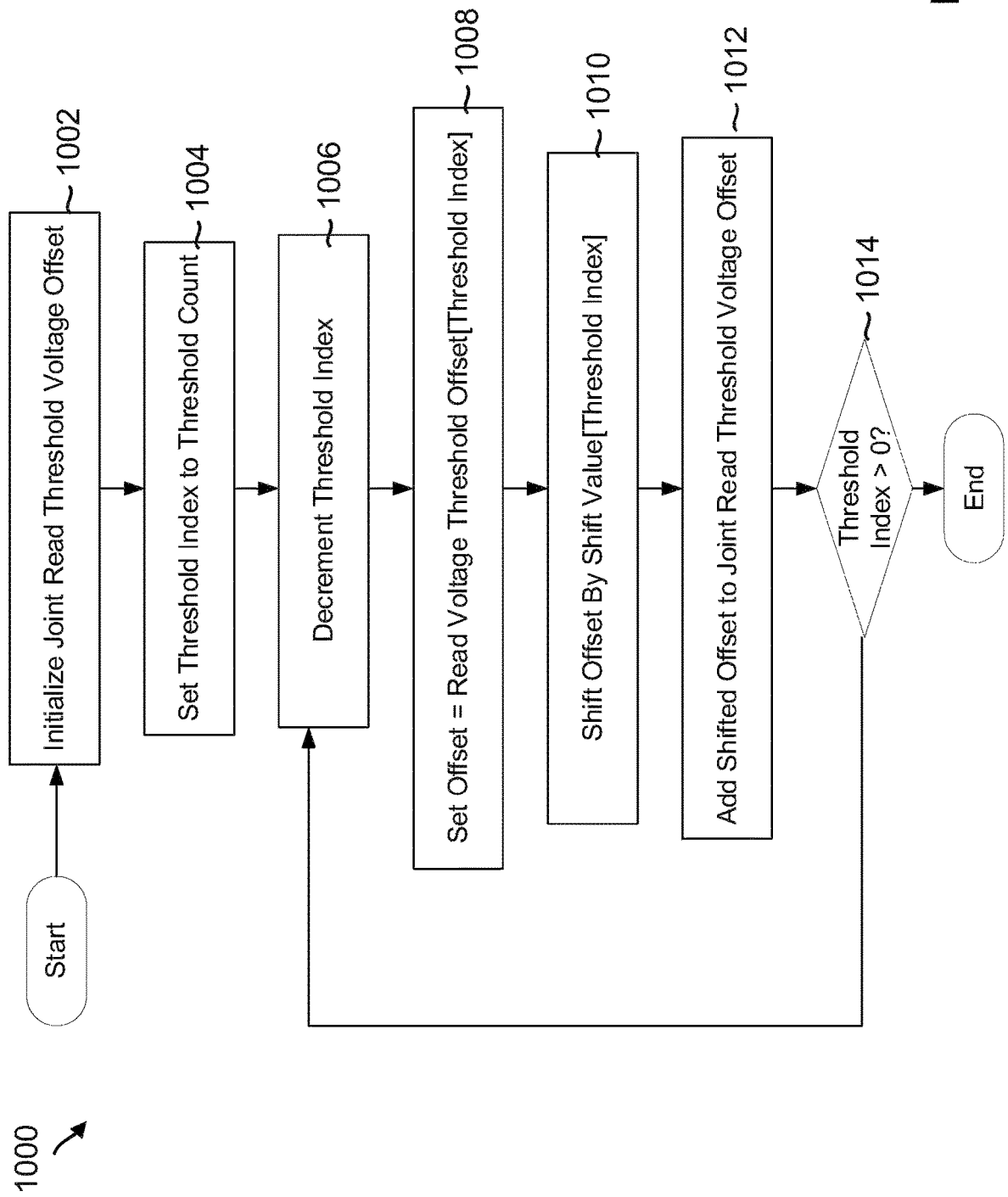
FIG. 10 is a flow chart illustrating an example of a method for shifting and combining read threshold voltage offsets into a joint read voltage threshold offset, as performed by the storage device of FIG. 1.

FIG. 10 illustrates an example flow chart 1000 of a method for shifting and combining read voltage threshold offsets into a joint read voltage threshold offset. For example, the method can be carried out in a storage device 102 such as the one illustrated in FIG. 1. Each of the steps in the flow chart can be controlled using the controller as described below (e.g. controller 123), by a component or module of the controller, or by some other suitable means. For example, each of the steps in the flow chart can be controlled by a circuit of the controller in hardware (e.g., circuit 900), by a module of the controller in software or firmware, or by a combination of hardware and software/firmware. Moreover, while FIG. 10 illustrates a specific example where the shifting and combining is done in a reverse approach to that described above with respect to FIG. 9 (e.g., here using down counting or left shifts), the process is merely an example and can alternatively be implemented using up counting, right shifting, or in other ways.

As represented by block 1002, the controller may initialize a joint read threshold voltage offset. For example, in software or firmware, the controller 123 may set the value of the joint read threshold voltage offset to all 0's. Alternatively in hardware, referring to FIG. 9, the controller 123 may initialize the joint read voltage threshold offset 904, as well as the shift register 906 and counter 914, to be all 0's.

As represented by block 1004, the controller may set a threshold index to a threshold count. For example, in software or firmware, the controller 123 may set a threshold index equal in value to the threshold count 706, 806 associated with a particular page type. Alternatively in hardware, referring to FIG. 9, the controller 123 may initially set counter 916 to the value of threshold count 918 (e.g., if counter 916 is replaced with a down counter rather than an up counter as described above).

As represented by block 1006, the controller may decrement the threshold index. For example, in software or firmware, the controller 123 may decrement the threshold index to correspond with a valid index of an array (or ordered list) of read threshold voltage offsets 604, 814. For instance, in the data structure 702, shift 0 may correspond to threshold index 0, shift 1 may correspond to threshold index 1, etc. Thus, if the threshold index is 2 for LPs such as illustrated in FIG. 8, the controller may decrement the index to 1 to correspond with shift value 1 (e.g., bit offset 16 in data structure 802). Alternatively in hardware, referring to FIG. 9, the controller 123 may decrement the value in counter 916.

As represented by block 1008, the controller may set an offset to the value of the read voltage threshold offset at the threshold index. For example, in software or firmware, the controller 123 may set the offset to the read voltage threshold offset 604, 814 corresponding to the current threshold index. For instance, referring to FIGS. 6 and 8, threshold index 0 may correspond to offset A' and threshold index 1 may correspond to offset E'. Thus, if the threshold index is currently 1 for LPs as described immediately above at block 1006, the controller may set the offset to offset E' in FIG. 6 or 8. Alternatively in hardware, referring to FIG. 9, the controller 123 may obtain the read voltage threshold offset 902 (i.e., offset E' in this example).

As represented by block 1010, the controller may shift the offset by the shift value corresponding to the threshold index. For example, in software or firmware, the controller 123 may shift the offset by the shift value 708, 808 associated with the current threshold index in data structure 702. For instance, if the threshold index is currently 1 for LPs as described immediately above, the controller may shift offset E' by 16 bits. Alternatively in hardware, referring to FIG. 9, the controller 123 may shift the read voltage threshold offset 902 using shift register 906 by the number of bits indicated in shift value 920.

As represented by block 1012, the controller may add the shifted offset to the joint read threshold voltage offset. For example, in software or firmware, the controller 123 may add the offset shifted by the shift value 708, 808 to the joint read voltage threshold offset initialized at block 1002. For instance, if the offset E' is 11111111, the controller may add the offset into the joint read voltage threshold offset to result in the value 000000000000000011111111100000000, where the third byte is indicated by offset E'. Alternatively in hardware, referring to FIG. 9, the controller may store the output of shift register 906 in latches 908.

As represented by block 1014, the controller may determine whether the threshold index is greater than 0. If so, e.g., there are additional read voltage thresholds to consider for a given page type, then the controller may repeat the process described above at blocks 1006, 1008, 1010, and 1012 for the next threshold. For instance, in software or firmware, the controller may check whether the threshold index >0 (here for example, threshold index 1 is greater than 0), and so the controller may decrement the threshold index from 1 to 0 to correspond with shift value 0 (e.g., bit offset 0 in data structure 802), set the new offset to the read voltage threshold offset corresponding to the new threshold index (e.g., offset A'), shift the offset by the shift value corresponding to the new threshold index (e.g., by 0 bits in this example), and add the shifted offset to the joint read threshold voltage offset (e.g., if offset A' is 01010101, joint read voltage threshold offset may be 010101010000000011111111100000000, where the first byte is indicated by offset A' and the third byte is indicated by offset E'). Alternatively in hardware, referring to FIG. 9, if the A=B output of comparator 912 is a logic 0, the controller 123 may again decrement the value in counter 916, obtain the next read voltage threshold offset 902 (i.e., offset A' in this example), shift the read voltage threshold offset 902 using shift register 906 by the number of bits indicated in shift value 920, and store the output of shift register 906 in latches 908 with the previously stored data.

The controller may similarly continue repeating the aforementioned process until the controller determines at block 1014 that the threshold index is no longer greater than 0. For example, in software or firmware, the controller 123 may refrain from adding additional offsets into the joint threshold voltage offset in response to determining that the threshold index is 0. Alternatively, in hardware, if the A=B output of comparator 912 is a logic 1, the counter 916 may no longer decrement and the joint read voltage threshold offset 904 may pass through the AND gates 928. Thus, the controller may determine the joint read voltage threshold offset for a given page type (e.g., in this example, 010101010000000011111111100000000, where the first byte is indicated by offset A' and the third byte is indicated by offset E'), and store the joint read voltage threshold offset in the read voltage threshold register 602, 812 accordingly.

Figure 11:
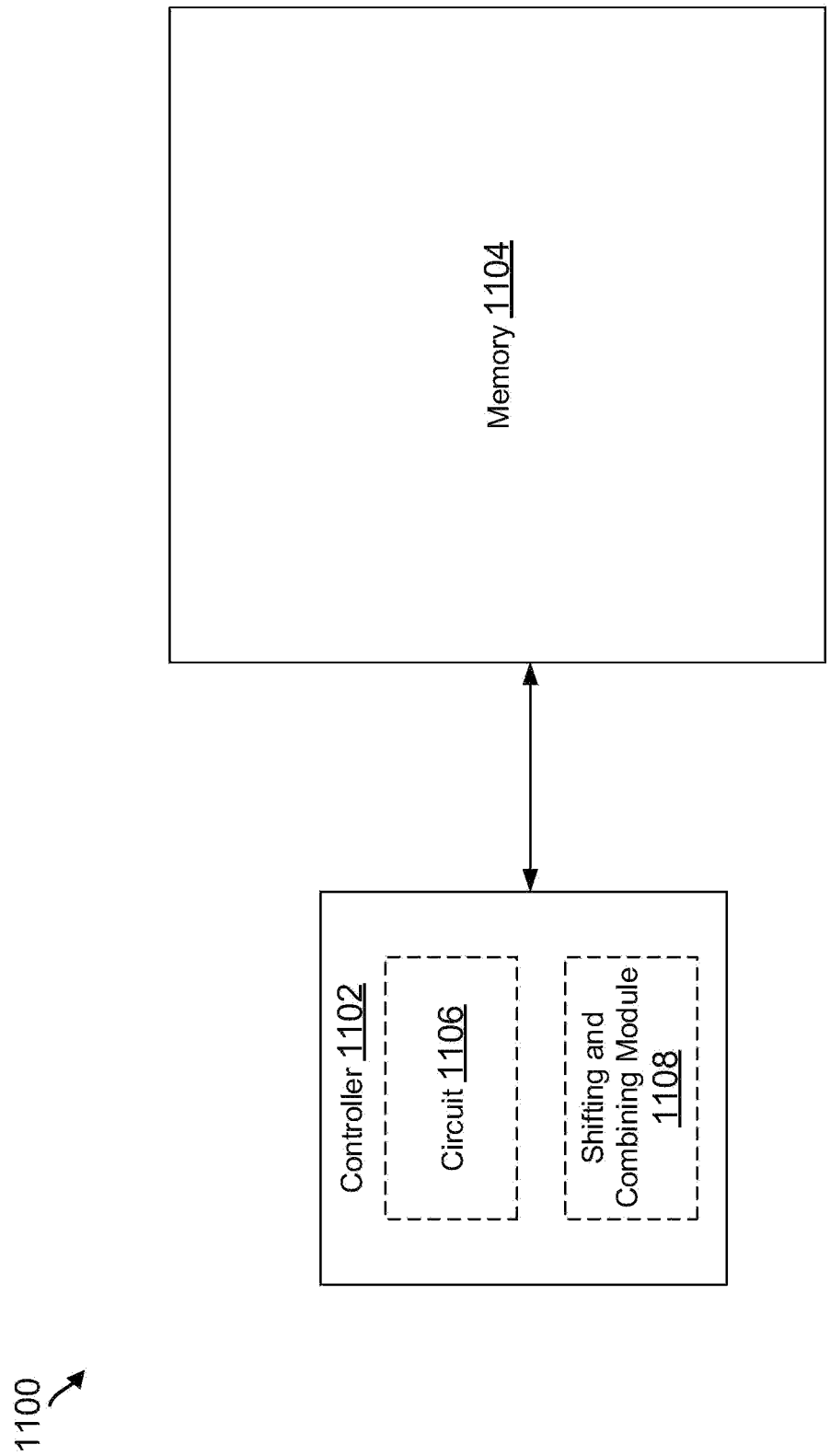
FIG. 11 is a conceptual diagram illustrating an example of a controller that shifts and combines read threshold voltage offsets into a joint read voltage threshold offset in the storage device of FIG. 1.

FIG. 11 is a conceptual diagram illustrating an example 1100 of a controller 1102 coupled to a memory 1104 in a storage device. For example, controller 1102 may correspond to controller 123 and memory 1104 may correspond to the NVM 110 of the storage device 102 in FIG. 1. The controller may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

In one example, the controller 1102 includes a circuit 1106 that may provide a means for shifting and combining read threshold voltage offsets into a joint read voltage threshold offset. For example, the circuit 1106 may be the circuit 900 described above with respect to FIG. 9, or a variation of circuit 900 (e.g., with different components or a different arrangement of components or logic design). In another example, the controller 1102 includes a shifting and combining module 1108 that may provide a means for shifting and combining read threshold voltage offsets into a joint read voltage threshold offset. For example, the shifting and combining module 1108 may perform the process or algorithm described above with respect to FIG. 10, or a similar process. For instance, the order or arrangement of the blocks in FIG. 10 may be modified in the similar process. Alternatively, the controller may implement a reverse approach to that described above with respect to FIG. 10, where for example, block 1004 is modified such that the threshold index is initially set to 0 (rather than the threshold count), block 1006 is modified such that the threshold index is incremented (rather than decremented), and block 1014 is modified such that the controller determines whether the threshold index is less than the threshold count (rather than greater than 0). Alternatively, the process may be varied in other ways.

Accordingly, the controller described in the present disclosure provides for instruction reduction and extensibility. As gray codes may change over time, or as NAND technologies may include more page types or read threshold voltages, the data structure 702, 802 (e.g., the configuration table) may grow without impacting controller logic for obtaining joint read voltage threshold offsets as described above. As a result, there may not be any cost in revalidating the aforementioned logic in firmware or hardware as the configuration table grows to include new parameters; rather, only a cost of validating the system with the new parameters may be expected. Moreover, by implementing the aforementioned logic in hardware such as described above with respect to FIG. 9 or 10, after the firmware of the controller programs the configuration table, the hardware of the controller may translate the thresholds in a single cycle. This approach may reduce the previous impact to QoS when computing and storing the optimal thresholds.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a memory;
   a circuit configured to shift and combine read threshold voltage offsets corresponding to optimized read voltage thresholds into a joint read voltage threshold offset; and
   a controller configured to store the joint read voltage threshold offset in the memory.

2. The storage device of claim 1, wherein the memory includes a read voltage threshold register, and the controller is configured to store the joint read voltage threshold offset in the read voltage threshold register.

3. The storage device of claim 2, wherein the read threshold voltage offsets are associated with inconsecutive memory locations of the read voltage threshold register.

4. The storage device of claim 1, wherein the controller is further configured to configure a data structure in the memory including a shift value for each of the read threshold voltage offsets, and wherein the circuit is configured to shift the read threshold voltage offsets according to the shift values.

5. The storage device of claim 4, wherein the data structure further includes a threshold count associated with the shift values, and wherein a number of the read threshold voltage offsets in the joint read voltage threshold offset is equivalent to the threshold count.

6. The storage device of claim 4, wherein each of the shift values in the data structure is associated with a page type.

7. A storage device, comprising:
a memory; and
a controller configured to:
configure a data structure in the memory including a shift value for each of a plurality of read threshold voltage offsets,
shift the read threshold voltage offsets according to the shift values,
combine the shifted read threshold voltage offsets into a joint read voltage threshold offset, and
store the joint read voltage threshold offset in the memory.

8. The storage device of claim 7, wherein the memory includes a plurality of read voltage threshold registers, and the controller is configured to store the joint read voltage threshold offset in one of the read voltage threshold registers.

9. The storage device of claim 8, wherein the read threshold voltage offsets are associated with inconsecutive memory locations of the one of the read voltage threshold registers.

10. The storage device of claim 7, wherein the shift values and a number of the read threshold voltage offsets are based on a block type, a page type, or a gray code layout of the storage device.

11. The storage device of claim 10, wherein the controller is further configured to configure a threshold count associated with the shift values in the data structure, and wherein the number of the read threshold voltage offsets in the joint read voltage threshold offset is equivalent to the threshold count.

12. The storage device of claim 10, wherein the data structure includes a page index associated with the shift values, the page index corresponding to the page type.

13. A storage device, comprising:
a memory including a read voltage threshold register;
means for shifting and combining read threshold voltage offsets into a joint read voltage threshold offset, the read threshold voltage offsets being shifted by different numbers of bits to align with respective memory locations of the read voltage threshold register; and
a controller configured to store the joint read voltage threshold offset in the memory.

14. The storage device of claim 13, wherein the means for shifting and combining comprises a circuit.

15. The storage device of claim 13, wherein the means for shifting and combining comprises a shifting and combining module of the controller.

16. The storage device of claim 13, wherein the memory includes multiple read voltage threshold registers including the read voltage threshold register, and the controller is configured to store the joint read voltage threshold offset in the read voltage threshold register.

17. The storage device of claim 16, wherein the read threshold voltage offsets are associated with discontinuous memory locations of the read voltage threshold register.

18. The storage device of claim 13, wherein the controller is further configured to configure a data structure in the memory including a shift value for each of the read threshold voltage offsets, and the means for shifting and combining is configured to shift the read threshold voltage offsets according to the shift values.

19. The storage device of claim 18, wherein the data structure further includes a number of thresholds associated with the shift values, and wherein a number of the read threshold voltage offsets in the joint read voltage threshold offset is equivalent to the number of thresholds.

20. The storage device of claim 18, wherein the data structure includes a page index associated with each of the shift values, the page index being associated with a page type.

* * * * *